(12) United States Patent
Takano

(10) Patent No.: US 10,546,818 B2
(45) Date of Patent: Jan. 28, 2020

(54) SEMICONDUCTOR PACKAGE INCLUDING TITANIUM OXIDE LAYER AND METHOD FOR MANUFACTURING THE SAME

(71) Applicant: Toshiba Memory Corporation, Tokyo (JP)

(72) Inventor: Yuusuke Takano, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 40 days.

(21) Appl. No.: 15/693,395

(22) Filed: Aug. 31, 2017

(65) Prior Publication Data

US 2018/0277488 A1 Sep. 27, 2018

(30) Foreign Application Priority Data

Mar. 22, 2017 (JP) .................................. 2017-056365

(51) Int. Cl.

| H01L 23/544 | (2006.01) |
|---|---|
| H01L 21/3205 | (2006.01) |
| B41M 5/26 | (2006.01) |
| H01L 21/268 | (2006.01) |
| H01L 21/56 | (2006.01) |
| H01L 23/552 | (2006.01) |
| H01L 23/31 | (2006.01) |

(Continued)

(52) U.S. Cl.
CPC ........... *H01L 23/544* (2013.01); *B41M 5/262* (2013.01); *H01L 21/268* (2013.01); *H01L 21/32051* (2013.01); *H01L 21/565* (2013.01); *H01L 23/3114* (2013.01); *H01L 23/552* (2013.01); *H01L 21/02186* (2013.01); *H01L 23/3121* (2013.01); *H01L 2223/54433* (2013.01)

(58) Field of Classification Search
CPC ............. H01L 23/3114; H01L 23/3121; H01L 23/3135; H01L 23/544; H01L 23/552; H01L 21/32051; H01L 21/565; H01L 2223/54486; H01L 21/02186; H01L 2223/54433

See application file for complete search history.

(56) References Cited

U.S. PATENT DOCUMENTS

| 6,586,057 B1 * | 7/2003 | Yabuki .................... G02B 1/111 428/1.1 |
|---|---|---|
| 8,508,023 B1 * | 8/2013 | Kelly ...................... H01L 24/97 257/659 |
| 8,736,030 B2 | 5/2014 | Yao et al. |

(Continued)

FOREIGN PATENT DOCUMENTS

| JP | 2000289128 A | 10/2000 |
|---|---|---|
| JP | 2002283729 A | 10/2002 |

(Continued)

*Primary Examiner* — Sonya D. McCall-Shepard
(74) *Attorney, Agent, or Firm* — Kim & Stewart LLP

(57) ABSTRACT

A semiconductor package includes a substrate, a semiconductor element disposed on the substrate, an encapsulating layer covering side surfaces and a top surface of the semiconductor element, an electromagnetic shield layer covering side surfaces of the substrate and side surfaces and a top surface of the encapsulating layer, and a titanium oxide layer formed above a top surface of the electromagnetic shield layer, and including a first portion containing divalent titanium oxide and a second portion containing tetravalent titanium oxide.

17 Claims, 3 Drawing Sheets

(51) Int. Cl.
*H01L 21/02* (2006.01)
*H01L 21/48* (2006.01)

(56) References Cited

U.S. PATENT DOCUMENTS

| | | |
|---|---|---|
| 9,190,387 B2 | 11/2015 | Yao et al. |
| 10,120,281 B2 | 11/2018 | Takahashi et al. |
| 2016/0079178 A1* | 3/2016 | Kim .................... H01L 23/544 |
| | | 257/773 |

FOREIGN PATENT DOCUMENTS

| | | |
|---|---|---|
| JP | 5318645 B2 | 10/2013 |
| TW | 201128758 A | 8/2011 |
| TW | 201438889 A | 10/2014 |
| TW | 201531514 A | 8/2015 |

\* cited by examiner

SEMICONDUCTOR PACKAGE INCLUDING TITANIUM OXIDE LAYER AND METHOD FOR MANUFACTURING THE SAME

CROSS-REFERENCE TO RELATED APPLICATION

This application is based upon and claims the benefit of priority from Japanese Patent Application No. 2017-056365, filed Mar. 22, 2017, the entire contents of which are incorporated herein by reference.

FIELD

Embodiments described herein relate generally to a semiconductor package and a semiconductor package manufacturing method.

BACKGROUND

In a semiconductor package, a shield film is provided on a semiconductor device via an encapsulant to mitigate influence of EMI (Electro Magnetic Interference). For identifying the semiconductor package, a mark is formed on the semiconductor package. The mark is formed thereon by performing laser processing on the encapsulant and then forming the shield film along an uneven portion generated by processing the encapsulant.

DETAILED DESCRIPTION

An embodiment provides a semiconductor package with improved visibility and a semiconductor package marking method.

In general, according to an embodiment, a semiconductor package includes a substrate, a semiconductor element disposed on the substrate, an encapsulating layer covering side surfaces and a top surface of the semiconductor element, an electromagnetic shield layer covering side surfaces of the substrate and side surfaces and a top surface of the encapsulating layer, and a titanium oxide layer formed above a top surface of the electromagnetic shield layer, and including a first portion containing divalent titanium oxide and a second portion containing tetravalent titanium oxide.

Embodiments of the present disclosure will be described hereinafter with reference to the drawings.

It is noted that the drawings are either schematic or conceptual and the relationship between a thickness and a width of each section, a proportion of magnitudes of sections, and the like are not necessarily identical to actual ones. Furthermore, even the same sections are often illustrated with different sizes or different proportions depending on the drawings.

In the specification and the drawings, similar elements to those already described with reference to the drawings already described are denoted by the same reference signs and description thereof is omitted as appropriate.

First Embodiment

Figure 1A:
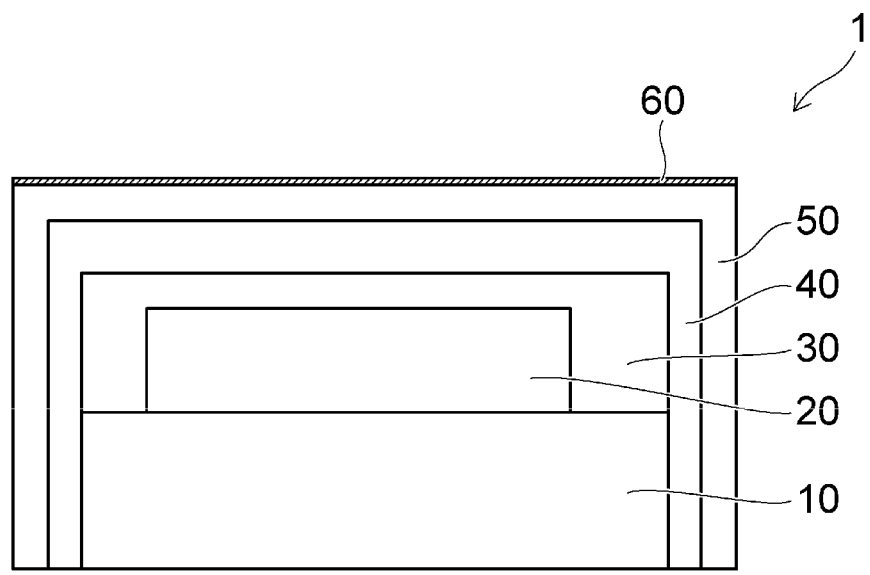
FIGS. 1A and 1B illustrate a semiconductor package according to an embodiment.
Figure 1B:
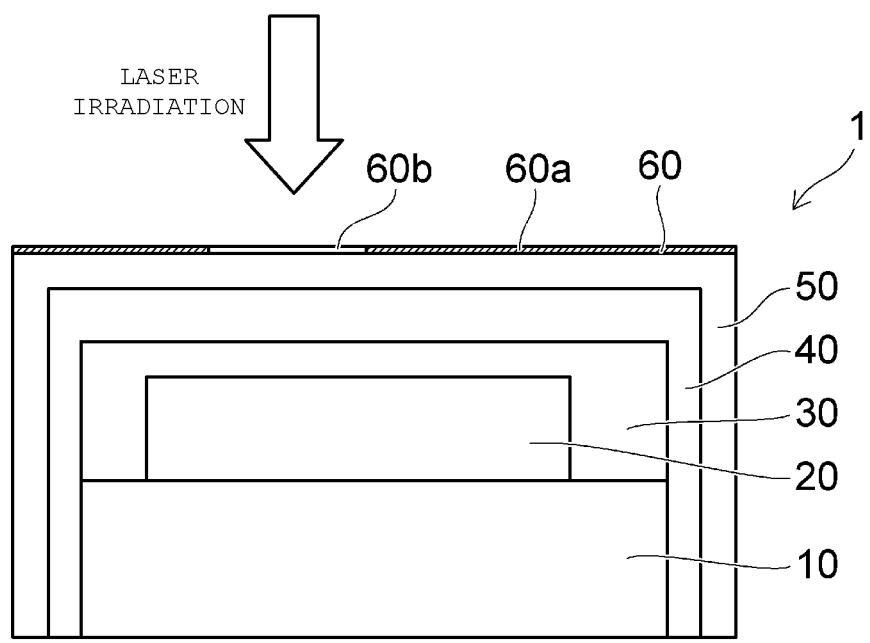
Figure 2A:
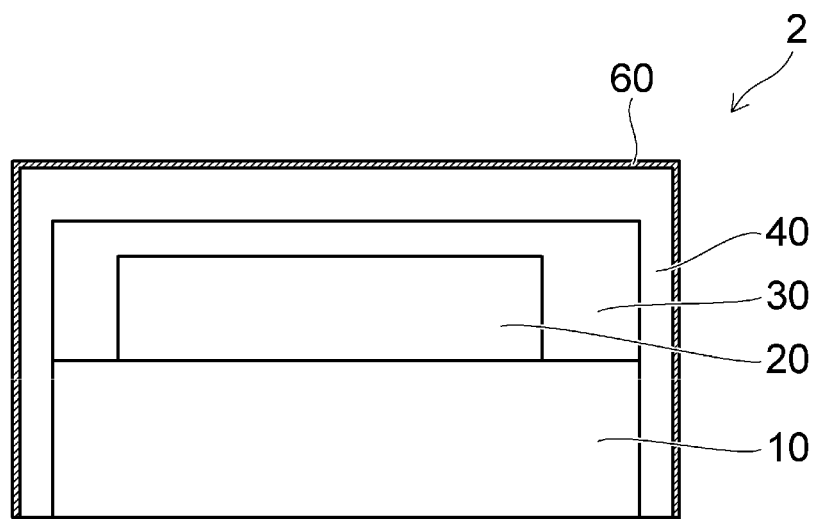
FIGS. 2A and 2B illustrate a semiconductor package according to a modification of the embodiment.
Figure 2B:
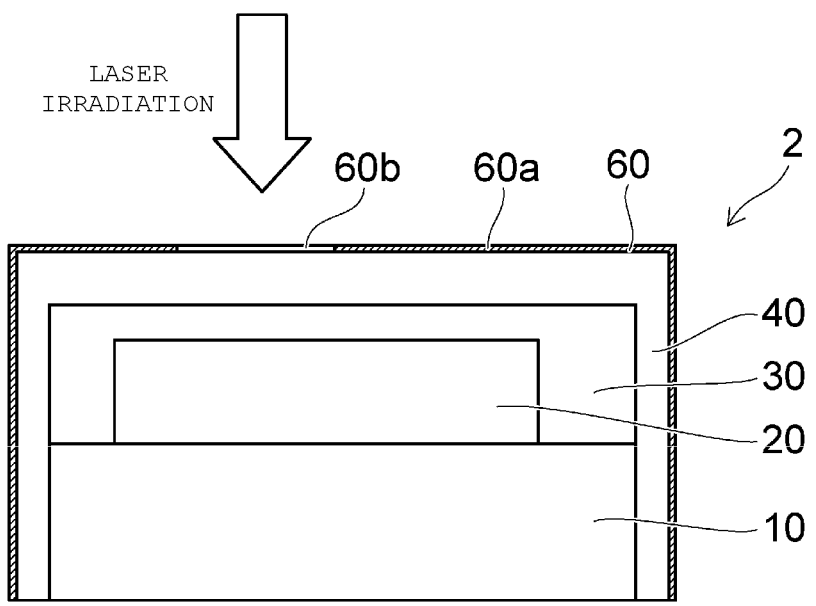

FIGS. 1A and 1B illustrate a semiconductor package according to an embodiment.
FIGS. 2A and 2B illustrate a semiconductor package according to a modification of the embodiment.

As shown in FIGS. 1A and 1B, a semiconductor package 1 includes a substrate 10, a semiconductor device 20, an encapsulant 30, a shield film 40, a protection film 50, and an identification film 60.

Examples of the substrate 10 include a semiconductor substrate, which contains silicon (Si). The substrate 10 may contain, for example, metal. The substrate 10 has, for example, a rectangular shape and serves as a base.

The semiconductor device 20 is provided on the substrate 10. The semiconductor device 20 is, for example, a semiconductor chip provided on the substrate 10.

The encapsulant 30 is provided on an upper surface of the substrate 10 in such a manner as to cover side surfaces and an upper surface of the semiconductor device 20. The encapsulant 30 contains, for example, a resin. Examples of the resin for forming the encapsulant 30 include a thermosetting resin and a thermoplastic resin. The encapsulant 30 may be formed of a photocurable resin.

The shield film 40 is provided on side surfaces of the substrate 10 and on the encapsulant 30. The shield film 40 covers the side surfaces of the substrate 10 and side surfaces and an upper surface of the encapsulant 30. By providing the shield film 40 as described above, the side surfaces and the upper surface of the semiconductor device 20 are covered and it is possible to mitigate an influence of EMI. The shield film 40 contains, for example, copper (Cu).

The protection film 50 is provided on the shield film 40 in such a manner as to cover side surfaces and an upper surface of the shield film 40. The protection film 50 contains, for example, at least one of iron (Fe), chromium (Cr), and nickel (Ni). For example, the protection film 50 is stainless steel that is either an alloy of iron (Fe), chromium (Cr), and nickel (Ni) or an alloy of iron (Fe) and chromium (Cr). A thickness of the protection film 50 is, for example, equal to or larger than 300 nanometers.

As shown in FIG. 1A, the identification film 60 is provided on an upper surface of the protection film 50. The identification film 60 may be provided on the protection film 50 in such a manner as to cover side surfaces and the upper surface of the protection film 50. The identification film 60 is a film containing, for example, titanium oxide (TiO). When the identification film 60 is the film containing the titanium oxide, the identification film 60 is formed on the protection film 50 by sputtering using oxygen ($O_2$) gas with titanium (Ti) set as a target. The identification film 60 may be formed by screen printing of a material containing the titanium oxide or by spray coating of the material containing the titanium oxide.

As shown in FIG. 1B, the identification film 60 includes a first section 60a and a second section 60b. The first section 60a is a section which is not irradiated with a laser beam after the identification film 60 is formed on the upper surface of the protection film 50. On the other hand, the second section 60b is a section which has been irradiated with the laser beam after the identification film 60 is formed on the upper surface of the protection film 50. That is, the second section 60b corresponds to a section which is processed by laser irradiation and which is marked.

When the identification film 60 is the film containing the titanium oxide (TiO), the first section 60a, which is not irradiated with the laser beam, contains divalent titanium oxide (TiO). On the other hand, the second section 60b, which has been irradiated with the laser beam, contains tetravalent titanium dioxide (TiO$_2$). A color of the first section 60a (TiO) is black whereas a color of the second section 60b (TiO$_2$) is white. That is, the color of the identification film 60, when being irradiated with the laser beam, partially changes from black to white. A reaction expressed by the following Chemical Formula (1) occurs by the laser irradiation.

$$2\text{TiO} + \text{O}_2 \rightarrow 2\text{TiO}_2 \quad (1)$$

Examples of processing conditions for the laser irradiation include a condition that a laser is a YAG laser. Since the chemical reaction represented by the above Formula (1) progresses at a temperature from 500° C. to 600° C., laser output power is power to such an extent that the chemical reaction represented by the above Formula (1) can progress. For example, the laser output power is 5 W. Furthermore, the temperature easily rises to 500° C. to 600° C. by laser marking and a temperature of an assembly step or a test step using the semiconductor package 1 is about 300° C. Therefore, in the assembly step including a reflow process, it is possible to ensure visibility of the marked section (which is the second section 60b) without changing the color of the identification film 60.

A thickness of the identification film 60 is set such that the black color of the first section 60a can be distinguished from the white color of the second section 60b after the reaction of the titanium oxide by the laser. If the identification film 60 is used not only as a mark identification film but also as a protection film that mitigates the influence of the EMI, the thickness of the identification film 60 is preferably equal to or larger than 0.1 micrometer.

A modification of the semiconductor package according to the above embodiment will be described below.

As shown in FIGS. 2A and 2B, a semiconductor package 2 includes the substrate 10, the semiconductor device 20, the encapsulant 30, the shield film 40, and the identification film 60. That is, the semiconductor package 2 according to the present modified embodiment does not include the protection film 50, compared with the semiconductor package 1.

As shown in FIG. 2A, the identification film 60 is provided on the shield film 40 in such a manner as to cover the side surfaces and the upper surface of the shield film 40. When the identification film 60 is the film containing the titanium oxide, the identification film 60 is formed on the shield film 40 by sputtering using the oxygen gas with titanium (Ti) set as a target.

As shown in FIG. 2B, the identification film 60 includes the first section 60a and the second section 60b. The first section 60a is the section which is not irradiated with the laser beam after the identification film 60 is formed on the upper surface of the shield film 40. On the other hand, the second section 60b is the section which has been irradiated with the laser beam after the identification film 60 is formed on the upper surface of the shield film 40. That is, the second section 60b corresponds to the section which is processed by laser irradiation and which is marked. When the identification film 60 is the film containing the titanium oxide, the color of the identification film 60 partially changes from black to white by the laser irradiation.

A semiconductor package marking method will be described below.

Figure 3:
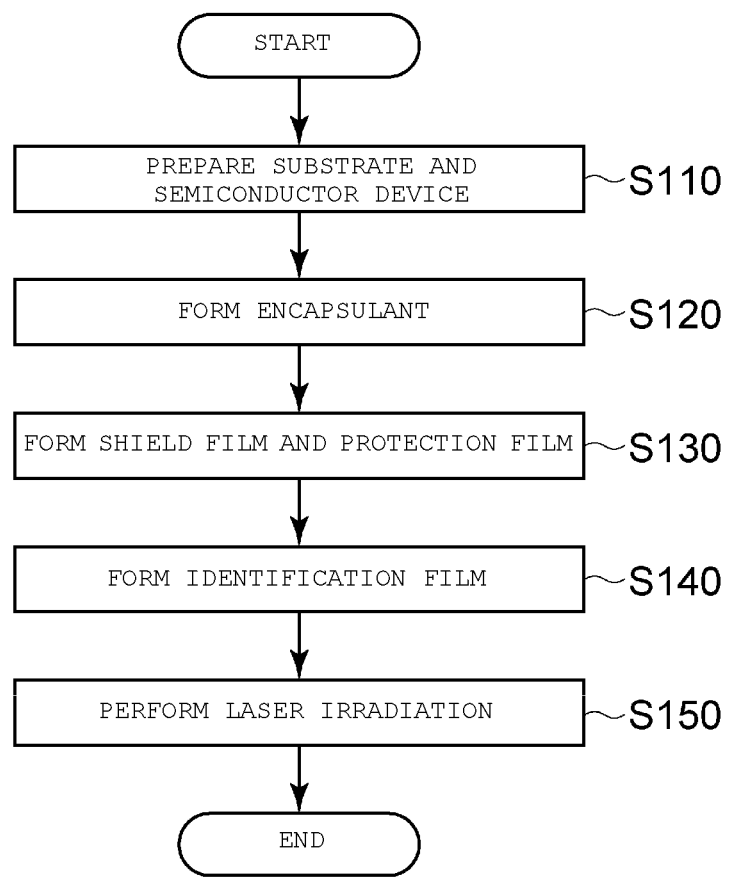
FIG. 3 is a flowchart illustrating a method of marking the semiconductor package according to the embodiment.

FIG. 3 is a flowchart illustrating the method of marking the semiconductor package according to the embodiment.

As shown in FIG. 3, the substrate 10 on which the semiconductor device 20 is disposed is prepared (S110).

Next, the encapsulant 30 is formed on the semiconductor device 20 (S120). The encapsulant 30 contains, for example, a resin and covers the side surface and the upper surface of the semiconductor device 20.

Next, the shield film 40 and the protection film 50 are formed on the encapsulant 30 in this order (S130). The shield film 40 covers the side surfaces and the upper surface of the encapsulant 30, and the protection film 50 covers the side surfaces and the upper surface of the shield film 40.

The shield film 40 and the protection film 50 are formed by a known method. For example, the shield film 40 and the protection film 50 are formed by sputtering. It is noted that the protection film 50 is not necessarily formed on the shield film 40.

Next, the identification film 60 is formed on the protection film 50 (S140). The identification film 60 contains, for example, titanium oxide and covers the upper surface of the protection film 50. The identification film 60 is formed by, for example, the sputtering. When being formed by, for example, the sputtering, the shield film 40, the protection film 50, and the identification film 60 can be formed continuously in a common chamber.

Next, the identification film 60 is processed by laser irradiation (S150). Examples of the processing conditions for the laser irradiation include a condition that the laser is the YAG laser and the output of the laser is 5 W. By laser irradiation, the identification film 60 includes the first section 60a which is not irradiated with the laser beam and the second section 60b which has been processed by the laser irradiation. The second section 60b corresponds to the marked section.

When the identification film 60 is the film containing the titanium oxide (TiO), the color of the first section 60a, which is not irradiated with the laser beam, remains black. On the other hand, the color of the second section 60b, which has been irradiated with the laser beam, changes to white. In this way, the semiconductor package 1 is marked by partially changing the color of the identification film 60 from black to white by the laser irradiation.

Advantages of the present embodiments will next be described.

A mark is conventionally formed on the semiconductor package by performing laser processing on the encapsulant and then forming the shield film along an uneven portion generated by processing the encapsulant. That is, by forming the shield film to follow the uneven portion, a recessed portion is generated to visually recognizable as the mark. When the mark is formed by the laser as described above, the laser output power for forming the mark is lowered in light of influence of heat on the semiconductor device. As a result, the uneven portion is formed to be shallow on the encapsulant. When the shield film is formed on this shallow uneven portion of the encapsulant, the shadow becomes lighter, resulting in degradation of the visibility.

In contrast, the semiconductor package 1 according to the present embodiment includes the identification film 60 having the second section 60b of which color changes by the laser irradiation. It is thereby possible to ensure the visibility of the mark on the semiconductor package 1.

Furthermore, according to the present embodiments, the identification film 60 is subjected to the laser processing after the shield film 40 and the protection film 50 are formed. Therefore, the influence of the heat on the semiconductor device 20 is mitigated, compared with a case of forming the mark by the uneven portion on the encapsulant. Moreover, the mark is formed by changing the color of the identification film 60 by the laser irradiation. Therefore, it is possible to ensure the visibility of the mark differently from the formation of the shallow uneven portion by the laser output power. Further, making the encapsulant 30 thinner enables a reduction in an overall thickness of the semiconductor package 1.

Furthermore, according to the present embodiments, the identification film 60 is formed by, for example, the sputtering and then irradiated with the laser beam. Therefore, the identification film 60 can be easily formed by existing equipment.

While the semiconductor package 1 having a structure to mitigate the influence of the EMI is described above by way of example, the semiconductor package 1 is not limited to this type. That is, the semiconductor package 1 does not necessarily include the shield film 40. In the structure of the semiconductor package 1, providing the identification film 60 having the second section 60b suffices.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor package comprising:
   a substrate;
   a semiconductor element disposed on the substrate;
   an encapsulating layer covering side surfaces and a top surface of the semiconductor element;
   an electromagnetic shield layer covering side surfaces of the substrate and side surfaces and a top surface of the encapsulating layer; and
   a titanium oxide layer formed above a top surface and on at least one side surface of the electromagnetic shield layer, wherein the part of the titanium oxide layer above the top surface of the electromagnetic shield layer comprises a first portion containing divalent titanium oxide and a second portion containing tetravalent titanium oxide and having a color different from a color of the first portion, and the part of the titanium oxide layer on said at least one side surface of the electromagnetic shield layer comprises the first portion containing divalent titanium oxide and does not comprise the second portion containing tetravalent titanium oxide.

2. The semiconductor package according to claim 1, wherein
   the second portion of the titanium oxide layer forms an identification mark.

3. The semiconductor package according to claim 1, wherein
   a thickness of the titanium oxide layer is equal to or greater than 0.1 μm.

4. The semiconductor package according to claim 1, wherein an area of the first portion formed above the top surface of the electromagnetic shield layer is greater than an area of the second portion formed above the top surface of the electromagnetic shield layer.

5. The semiconductor package according to claim 1, wherein the titanium oxide layer is formed on a flat surface above the top surface of the electromagnetic shield layer.

6. The semiconductor package according to claim 1, wherein
   the encapsulating layer is formed of a resin, and the electromagnetic shield layer is formed of copper.

7. A semiconductor package comprising:
   a substrate;
   a semiconductor element disposed on the substrate;
   an encapsulating layer covering side surfaces and a top surface of the semiconductor element;
   an electromagnetic shield layer covering side surfaces of the substrate and side surfaces and a top surface of the encapsulating layer; and
   a titanium oxide layer formed above a top surface of the electromagnetic shield layer, and including a first portion containing divalent titanium oxide and a second portion containing tetravalent titanium oxide and having a color different from a color of the first portion, an area of the first portion being greater than an area of the second portion.

8. The semiconductor package according to claim 7, wherein
   the second portion of the titanium oxide layer forms an identification mark.

9. The semiconductor package according to claim 7, wherein
   a thickness of the titanium oxide layer is equal to or greater than 0.1 μm.

10. The semiconductor package according to claim 7, wherein
    the titanium oxide layer is formed on a flat surface above the top surface of the electromagnetic shield layer.

11. The semiconductor package according to claim 7, wherein
    the encapsulating layer is formed of a resin, and the electromagnetic shield layer is formed of copper.

12. A semiconductor package comprising:
    a substrate;
    a semiconductor element disposed on the substrate;
    an encapsulating layer covering side surfaces and a top surface of the semiconductor element;
    an electromagnetic shield layer covering side surfaces of the substrate and side surfaces and a top surface of the encapsulating layer;
    a protection layer that covers side surfaces and a top surface of the electromagnetic shield layer; and
    a titanium oxide layer formed on a top surface of the protection layer, and including a first portion containing divalent titanium oxide and a second portion containing tetravalent titanium oxide and having a color different from a color of the first portion.

13. The semiconductor package according to claim 12, wherein
    the second portion of the titanium oxide layer forms an identification mark.

14. The semiconductor package according to claim 12, wherein
    a thickness of the titanium oxide layer is equal to or greater than 0.1 μm.

15. The semiconductor package according to claim 12, wherein
    the protection layer is formed of a material containing ferromagnetic metal.

16. The semiconductor package according to claim 12, wherein
    the titanium oxide layer is formed on a flat surface region at the top surface of the protection layer.

17. The semiconductor package according to claim 12, wherein the encapsulating layer is formed of a resin, and the electromagnetic shield layer is formed of copper.

* * * * *